United States Patent [19]
Lee et al.

[11] Patent Number: 5,965,005
[45] Date of Patent: Oct. 12, 1999

[54] MASK FOR POROUS SILICON FORMATION

[75] Inventors: Ming-Kwei Lee; Yu-Hsiung Wang, both of Kao Hsiung, Taiwan

[73] Assignee: National Science Council, Taipei, Taiwan

[21] Appl. No.: 08/934,837

[22] Filed: Sep. 22, 1997

[51] Int. Cl.$^6$ ....................................... C25F 3/00
[52] U.S. Cl. .................. 205/656; 205/665; 205/666; 205/667
[58] Field of Search .................. 205/656, 666, 205/674, 667, 665

[56] References Cited

U.S. PATENT DOCUMENTS

| | | | |
|---|---|---|---|
| 4,119,993 | 10/1978 | Hartnagel et al. | 357/23 |
| 4,248,683 | 2/1981 | Shaw | 204/129.3 |
| 4,268,348 | 5/1981 | Allison et al. | 156/645 |
| 4,303,482 | 12/1981 | Buhne et al. | 204/129.3 |
| 4,874,484 | 10/1989 | Foell et al. | 204/129.3 |
| 4,876,210 | 10/1989 | Barnett et al. | 437/5 |
| 5,139,624 | 8/1992 | Searson et al. | 204/129.3 |
| 5,141,894 | 8/1992 | Bisaro et al. | 437/132 |
| 5,145,809 | 9/1992 | Walker | 437/203 |
| 5,183,776 | 2/1993 | Lee | 437/110 |
| 5,221,637 | 6/1993 | De Boeck | 437/132 |
| 5,256,594 | 10/1993 | Wu et al. | 437/89 |
| 5,352,341 | 10/1994 | Joyner | 204/129.1 |
| 5,828,088 | 10/1998 | Mauk | 438/29 |

OTHER PUBLICATIONS

Canham, L.T.: "Silicon quantum wire array fabrication by electrochemical and chemical dissolution of wafers", Appl. Phys. Lett. 57 (1990) 1046 No month given.

Nassiopoulos, et al.: "Sub–micron luminescent porous silicon structures using lithographically patterned substrates", Thin Solid Films 255 (1995) 329–333 No month given.

Steckl et al.: "Selective–area room temperature visible photoluminescence from SiC/Si heterostructures", Appl. Phys. Lett. 64 (1994) 1419 No month given.

Barbour, et al.: "Ion–irradiation control of photoluminescence from porous silicon", Appl. Phys. Lett. 59 (1991) 2088–2090 No month given.

Doan, et al.: "Photolithographic fabrication of micron–dimension porous Si structures exhibiting visible luminescence", Appl. Phys. Lett. 60 (1992) 619–620 No month given.

Steckl, et al.: "Doping–induced selective area photoluminescence in porous silicon", Appl. Phys. Lett. 62 (1993) 1982–1984 No month given.

Bao, et al.: "Control of porous silicon luminescent pattern formation by ion implantation", Appl. Phys. Lett. 63 (1993) 2246–2247 No month given.

Siu, et al.: "Basic Properties of the Electrolyte–$SiO_2$–Si system: Physical and Theoretical Aspects", IEEE Trans. Electron Devices 26 (1979) 1805–1815 No month given.

Darrort, et al.: "Quantitative study by atomic force microscopy and spectrophotometry of the roughness and brightness of Electrodeposited nickel in the presence of additives", Thin Solid Films 265 (1995) 52–57 No month given.

*Primary Examiner*—Kathryn Gorgos
*Assistant Examiner*—Thomas H Parsons
*Attorney, Agent, or Firm*—Trademark & Patent Counsellors of America, P.C.; John L. Chiatalas; Michael J. Brown

[57] ABSTRACT

The present invention provides a method for forming porous silicon, which includes the steps of: a) providing a silicon substrate; b) growing a GaAs layer on the silicon substrate; c) defining a pattern for the GaAs layer by a photolithography process and etching the patterned GaAs layer to obtain a GaAs mask; and d) forming a porous silicon layer by anodic-oxidation-etching the silicon substrate uncovered by the GaAs mask. By this method, etching under the GaAs layer on the silicon substrate can be executed very well to form the porous silicon. And the patterned GaAs layer is etched by a process in step c), which is selected from a wet etching and a dry etching process with a photoresist as a mask. In addition, the anodic-oxidation-etching process in step d) is an electrolytic process executed in HF acidic solution which is a mixture of 30 vol. % HF and 70 vol. % $H_2O$, in which the HF concentration is 49 wt. %.

16 Claims, 7 Drawing Sheets

(PRIOR ART)

Fig. 2(b)

(PRIOR ART)

MASK FOR POROUS SILICON FORMATION

FIELD OF THE INVENTION

The present invention relates to a method for defining a patterned porous silicon, and especially to one processed by the GaAs masking layer.

BACKGROUND OF THE INVENTION

So far silicon is the most popular material in the semiconductor industry. It is also the most mature material in the fabrication of semiconductor devices and microcircuits. Since its luminescent efficiency is extremely low due to its property of indirect energy gap, it is impossible for it to be applied directly to the fabrication process of optoelectronic devices. After it was discovered that porous silicon has the property of direct energy gap because of its zone folding and quantum confinement effects, and has an intense visible photoluminescene spectrum, application of the porous silicon material in optoelectronic devices was widely studied. It is necessary to reduce the porous silicon optoelectronic devices in concert with the present VLSI skill for developing the optoelectronic integrated circuits of silicon.

Generally speaking, the benefits for the fabrication process of porous silicon are easy to fabricate, low cost and able to avoid the problems of lattice mismatch, expensive price and much timeconsuming in fabricating the optoelectronic integrated circuit with previous compound semiconductors. It is worthwhile in the market if the porous silicon optoelectronic devices are applied to the mature silicon integrated circuit, and their fabrication process could be significantly simplified. But there are some shortcomings in finishing the necessary miniaturing process of porous silicon optoelectronic devices. For it is necessary to face a fundamental problem that a prior masking layer has either a lifetime too short or a utility quality too poor in the conventional fabrication process of the porous silicon for size-reducing porous silicon optoelectronic devices. In other words: the disadvantages still exist in the prior art though they can size-reduce the porous silicon optoelectronic devices.

Now we talk about general masking layers applied to finish the size-reducing purpose for defining the growing region of porous silicon. The size-reducing skill can be classified into two types: one is the traditional photolithography and the other is the non-traditional skill. The former includes masking layers respectively formed by silicon oxide, silicon nitride and silicon carbide. But the disadvantages of these masking layers are: the $SiO_2$ masking layer would dissolve immediately in the HF acidic solution, and cannot be used because of its too short lifetime; and the porous silicon formed by anodic-oxidation etching on the silicon substrate under the $Si_3N_4$ masking layer, which cannot dissolve in the HF acidic solution, is easy to strip off because of the undercut phenomenon resulting in a distorted defined region under $Si_3N_4$/Si interface having no depletion region as a result of isotropic etching.

Figure 1A:
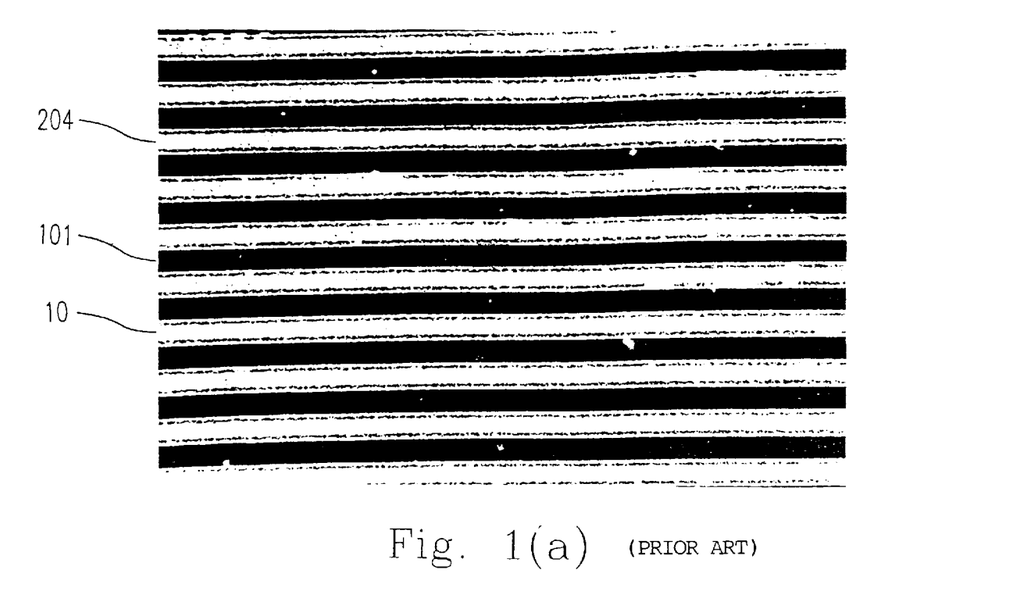
FIG. 1(a) is a photograph by scanning electron microscope, in which the conventional silicon nitride masking layer is used to define the patterned porous silicon and the electrolytic process is executed for one minute.
Figure 1B:
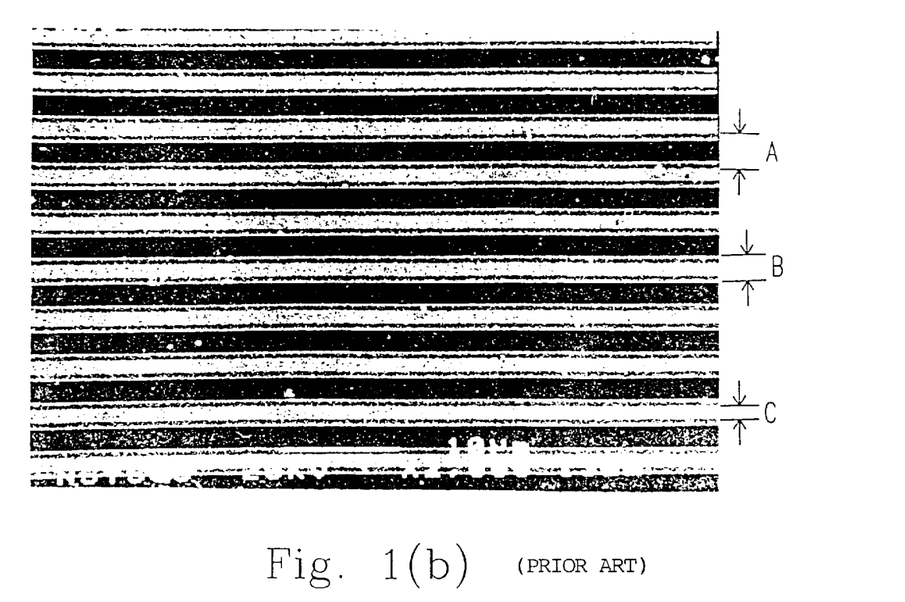
FIG. 1(b) is a photograph by scanning electron microscope, in which the masking layer is the same as in Prior Art FIG. 1(a) and the electrolytic process is executed for two minutes.

As shown in Prior Art FIGS. 1(a)–1(d), they are the photographs by scanning electron microscope, in which the silicon nitride masking layer is used to define the patterned porous silicon. The silicon nitride masking layer is grown by low pressure chemical vapor deposition, and its pattern is formed by wet chemical etching. Prior Art FIGS. 1(a)–1(d) are scanning electron microscope photographs magnified by the scale of 2,000 times, in which the bar scales are all 10 μm and 2 mm represents 1 μm. Prior Art FIGS. 1(a)–1(d) show the formations of the defined patterned region of porous silicon 101 under the silicon nitride masking layers 204, as shown in the figures in which the dark bands are porous silicon 101 and the bright bands are masking layers 204. The area A in FIG. 1(b) is the porous silicon 101, the area B is the silicon nitride masking layer 204 and the area C is the silicon substrate 10.

Figure 1C:
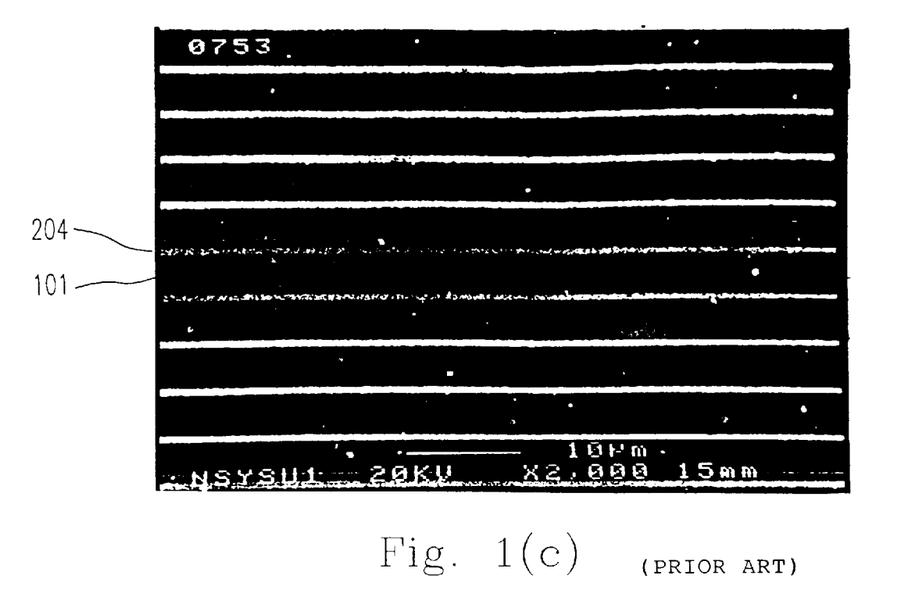
FIG. 1(c) is a photograph by scanning electron microscope, in which the masking layer is the same as in Prior Art FIG. 1(a) and the electrolytic process is executed for three minutes.
Figure 1D:
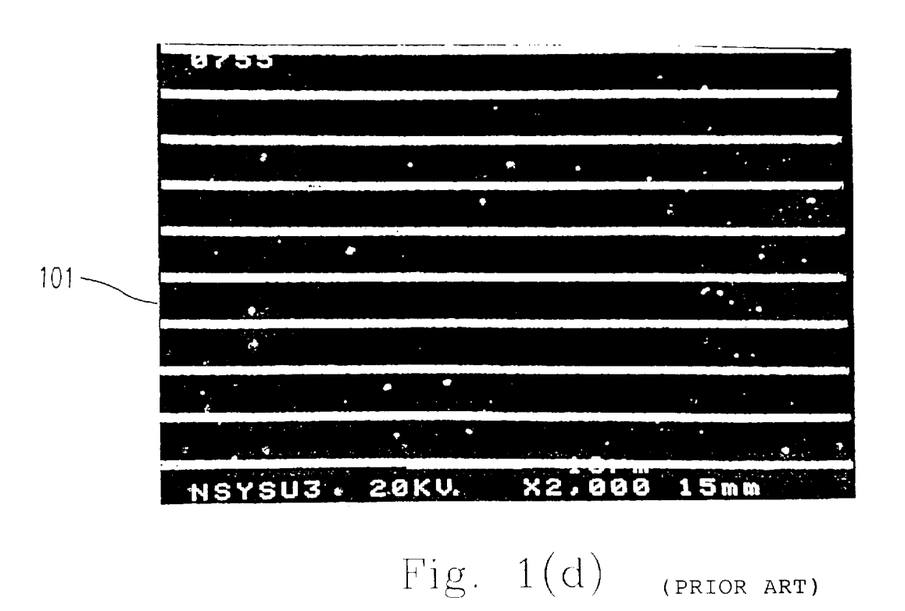
FIG. 1(d) is a photograph by scanning electron microscope, in which the masking layer is the same as in Prior Art FIG. 1(a) and the electrolytic process is executed for five minutes.

The anodization times in these figures are respectively: one minute for Prior Art FIG. 1(a), two minutes for Prior Art FIG. 1(b), three minutes for Prior Art FIG. 1(c) and five minutes for Prior Art FIG. 1(d). The accompanied growing conditions of the porous silicon are: current density 3.5 mA/cm², and the anodization solution of a mixture of 30 vol. % HF and 70 vol. % $H_2O$, in which the HF concentration is 49 wt. %. In Prior Art FIGS. 1(a)–1(d), it is apparent that the longer the anodization time, the more serious the distortion of the patterned porous silicon.

Figure 2A:
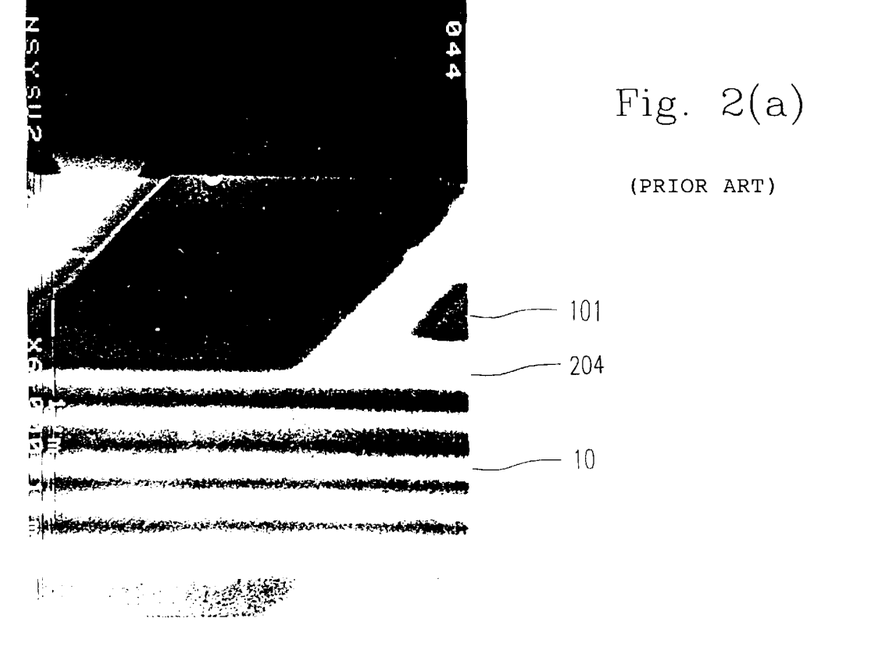
FIG. 2(a) is a scanning electron microscope photograph of a cross-section of the prior masking layer in FIG. 1(d)
Figure 2B:
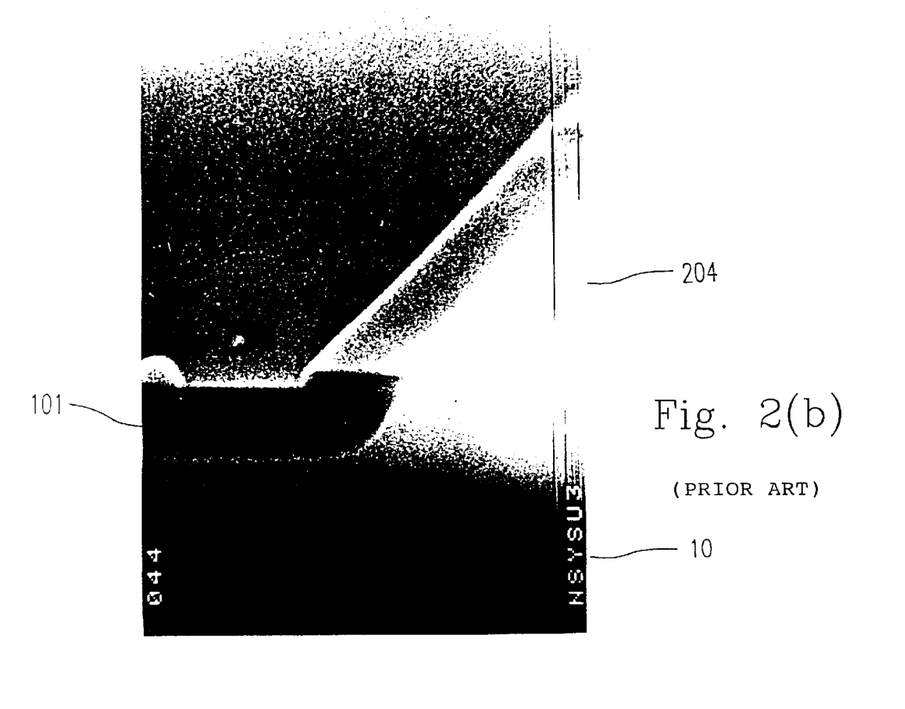
FIG. 2(b) is a locally amplified photogragh of the masking layer in Prior Art FIG. 2(a)

Referring now to Prior Art FIGS. 2(a) and (b), they are the scanning electron microscope photographs for a cross-section of patterned porous silicon under the silicon nitride mask in Prior Art FIG. 1(d). Prior Art FIG. 2(b) is a locally amplified photogragh of Prior Art FIG. 2(a). Prior Art FIG. 2(a) is magnified by 6000 times, in which the bar scale is 1 μm and 0.6 cm represents 1 μm. Prior Art FIG. 2(b) is magnified by 20,000 times, which is an amplified photograph of Prior Art FIG. 2(a) and its bar scale is 1 μm. We should note that Prior Art FIG. 2(a) is the cross-sectional scanning electron microscope scanning photograph of Prior Art FIG. 1(d), which shows that the patterned porous silicon 101 on the silicon substrate 10 is defined by utilizing the silicon nitride mask and the electrolytic conditions are the same as those in Prior Art FIG. 1(d).

It is apparent that the transverse growth size and the vertical growth size of the porous silicon under the silicon nitride masking layer are almost in the ratio of 1.3:1 after the electrolytic process in Prior Art FIG. 2(b). The part of the silicon nitride film on the transverse growth region of the porous silicon is slightly stripped off in Prior Art FIG. 1(d), which is really a worse condition since the porous silicon growth will be more isotropic. For this reason, we know the silicon nitride masking layer is not proper to be used to define the patterned porous silicon. In a similar condition, the short lifetime and serious distortion also exist in the masks of silicon oxide and silicon carbide, so all the masking layers are not practical. The isotropic growth, short lifetime and serious distortion are main defects of the conventional photolithography.

Now we consider the non-traditional skill, such as the ion irradiation, photoanodic etching, focused ion beam implantation and amorphization. This type would lead to destruction in non-porous silicon growth region, so it is worse than the conventional type discussed above for the fabrication of optoelectronic integrated circuit. And it is not practical and improper to modern integrated circuit, in avoiding the complex followed fabrication process, such as recrystallization or planarization to recover the original crystal structure having no grown porous silicon region.

It is therefore tried by the applicant to deal with the above shortcomings suffered by the prior mask skills.

SUMMARY OF THE INVENTION

It is therefore an object of the present invention to provide a more practical and effective masking layer to form the porous silicon on the silicon substrate during the process of oxidation reduction etching.

It is therefore another object of the present invention to provide a masking layer of better pattern transfer effect to form the porous silicon.

It is therefore still another object of the present invention to provide a masking layer uneasy to be broken upon etching.

According to the present invention, the inventor provides a method for forming porous silicon, which includes steps of: a) providing a silicon substrate; b) growing a GaAs layer on the silicon substrate; c) defining a pattern for the GaAs layer by a photolithography process and etching the patterned GaAs layer to obtain a GaAs mask; and d) forming a porous silicon layer by anodic-oxidation-etching the silicon substrate uncovered by the GaAs mask. By this method, the etching under the GaAs layer on the silicon substrate can be executed very well to form the porous silicon.

Preferably the patterned GaAs layer is etched by a process in step c), which is selected from a wet etching and a dry etching processes with a photoresist as a mask. And the wet etching process or the dry etching process for the pattern transfer is executed by the photoresist.

Preferably the anodic-oxidation-etching process in step d) is an electrolytic process executed in an HF acidic solution.

Certainly, the HF acidic solution can be a mixture of 30 vol. % HF and 70 vol. % $H_2O$. The normally available concentrated acid is 49 wt. % HF with water as the second component.

Certainly, the electrolytic process can be executed for five minutes in a current density of 3.5 $mA/cm^2$, the transverse growth size and the vertical growth size of the porous silicon are almost in the ratio of 0.7:1 after the electrolytic process and this growth condition is transversely compressed.

Preferably the silicon substrate is composed of crystalline silicon.

Preferably the crystalline silicon is of p-type.

Certainly, the silicon substrate can be a boron-doped subsrtate having a resistivity of 20–30 Ω-cm, a (100) 4° off toward (001).

Certainly, the silicon substrate can be composed of n-type crystalline silicon rather than p-type crystalline silicon.

Preferably in step b), the GaAs layer is deposited on the silicon substrate as an epilayer by vapor phase epitaxy (VPE).

Preferably the vapor phase epitaxy is a process of chemical vapor deposition (CVD).

Certainly, the chemical vapor deposition can be executed by two-step organometallic chemical vapor deposition (MOCVD).

Certainly, in step b), the GaAs layer can be grown on the silicon substrate by molecular beam epitaxy (MBE) rather than VPE.

Preferably in step b), the GaAs layer is formed on the silicon substrate by liquid phase epitaxy (LPE) rather than MBE.

Preferably the GaAs layer is a single-crystal film of groups IIIA–VA.

The fabrication process of the mature silicon integrated circuit which reduces the optoelectronic devices can be significantly simplified by the present invention to form the patterned porous silicon, and the cost would be lowered on account of the above properties mentioned about the GaAs masking layer. So the technigue for the GaAs mask is rich in market value and developing potentiality.

The benefits of this GaAs masking layer include: 1) better resistance to etch than other masking layers (such as silicon nitride, silicon oxide or silicon carbonide); 2) anisotropic growth in the growing direction of the porous silicon as a result of using the GaAs masking layer (with the ratio of the transverse/vertical growth sizes smaller than 1; 3) no damage to the nonporous silicon region during the photolithography etching process, in which the damage of the nonporous silicon occurs if we use ion implantation or irradiation. So we do not only complete the purpose of size-reduction of the optoelectronic devices of the porous silicon in the integrated circuit, but are also able to fabricate optoelectronic integrated circuit on the mature integrated circuit of silicon and GaAs. In addition, the porous silicon has the property of being easily oxidated to become isolated, which is a benefit that cannot be omitted.

For the junction of GaAs/Si is heterogeneous, there is a depletion region on the interface thereof which is lack of hole carriers. Accordingly, the GaAs/Si is necessary. This condition is disadvantageous to form the porous silicon which needs holes to facilitate it easy formation. The present invention provides a masking layer which has a junction on the silicon substrate, and it is not easy to form the porous silicon on the junction of GaAs/Si. The GaAs masking layer is uneasy to be stripped off after the anisotropic porous silicon layer is formed thereunder. This is the basic principle of the invention.

This method in defining successfully the patterned porous silicon by the GaAs epitaxial layer enhances significantly the possibility of the fabrication of the optoelectronic integrated circuit by combining the porous silicon optoelectronic devices and the advanced Si integrated circuit technique existing. It can be similarly applied to form porous silicon on ZnSe/Si or InP/Si which use respectively single-crystal film of groups IIB–VIA or groups IIIA–VA according to the basic principle of the invention.

The present invention may best be understood through the following description with reference to the accompanying drawings, in which.

BRIEF DESCRIPTION OF DRAWINGS

Prior Art

Prior Art

Prior Art

Prior Art

Prior Art

Prior Art

DETAILED DESCRIPTION OF THE PREFERRED EMBODIMENT

Figure 1E:
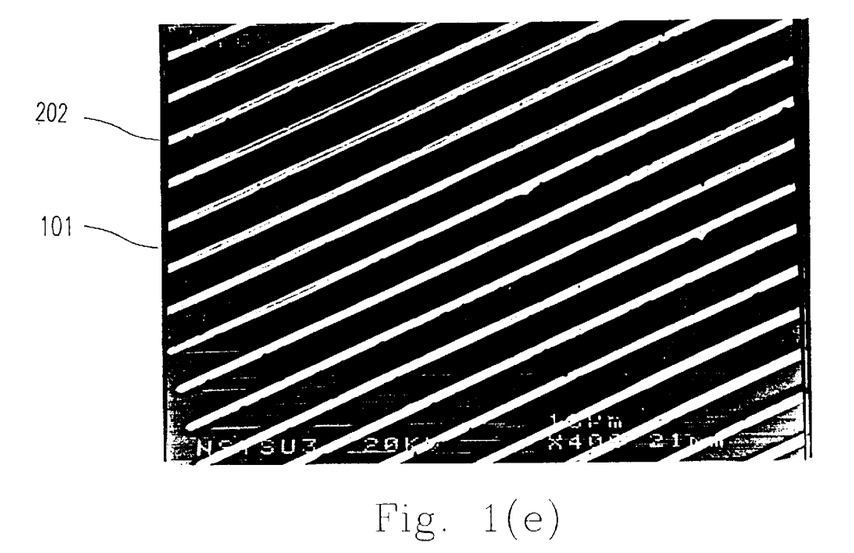
FIG. 1(e) is a scanning electron microscope photograph, in which the patterned porous silicon has been completely formed by using the GaAs masking layer according to a preferred embodiment of the present invention.
Figure 1F:
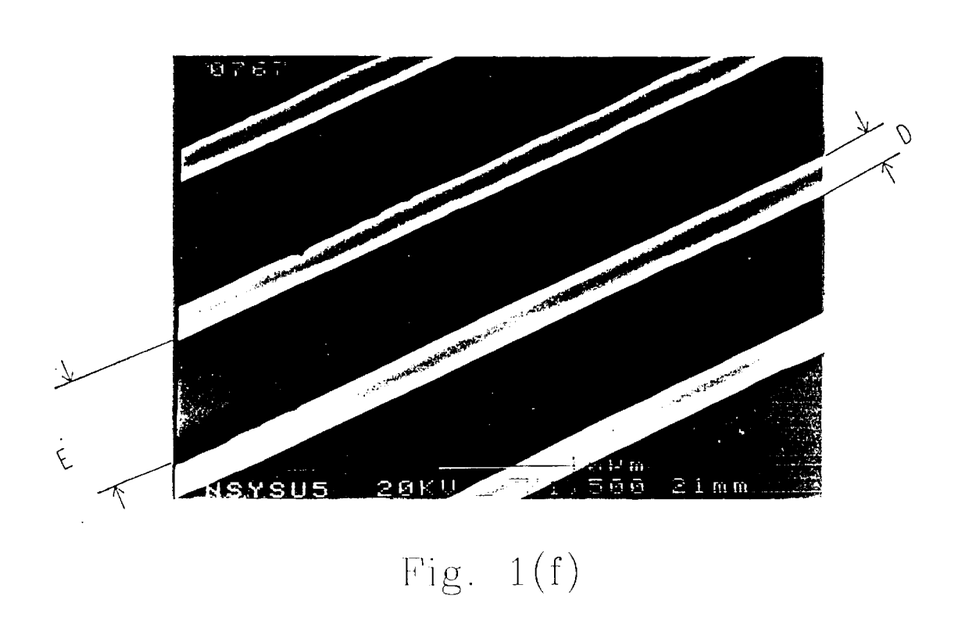
FIG. 1(f) is a scanning electron microscope photograph locally amplifying FIG. 1(e)

Referring now to FIGS. 1(e) & 1(f), there are shown two scanning electron microscope photographs and the latter is a local amplification of the former, in which the patterned porous silicon is completely formed by using the GaAs masking layer according to a preferred embodiment of the present invention. The photograph of FIG. 1(e) is magnified by 400 times, in which the bar scale is 10 μm and 0.4 mm is represented by 1 μm. And the photograph of FIG. 1(f) is magnified by 1,500 times, in which the bar scale is 10 μm and 1.5 mm is represented by 1 μm. We can see that the present invention uses the GaAs masking layer 202 to define the patterned porous silicon 101 in those two photographs, in which the bright bands are the GaAs masking layer 202 and the dark bands are the porous silicon 101. The D area is the GaAs masking layer 202 and the E area is the porous silicon 101 in FIG. 1(f) which is an amplified photograph of FIG. 1(e).

The electrolytic process is executed for five minutes in a current density of 3.5 mA/cm$^2$ in FIG. 1(e). And the anodization solution is a mixture of 30 vol. % HF and 70 vol. % H$_2$O, in which the HF concentration is 49 wt. %. The visible light isn't able to pass through the GaAs masking layer, so the distortion condition of the patterned porous silicon cannot be observed by the surface scanning photograph in FIG. 1(e).

Figure 3:
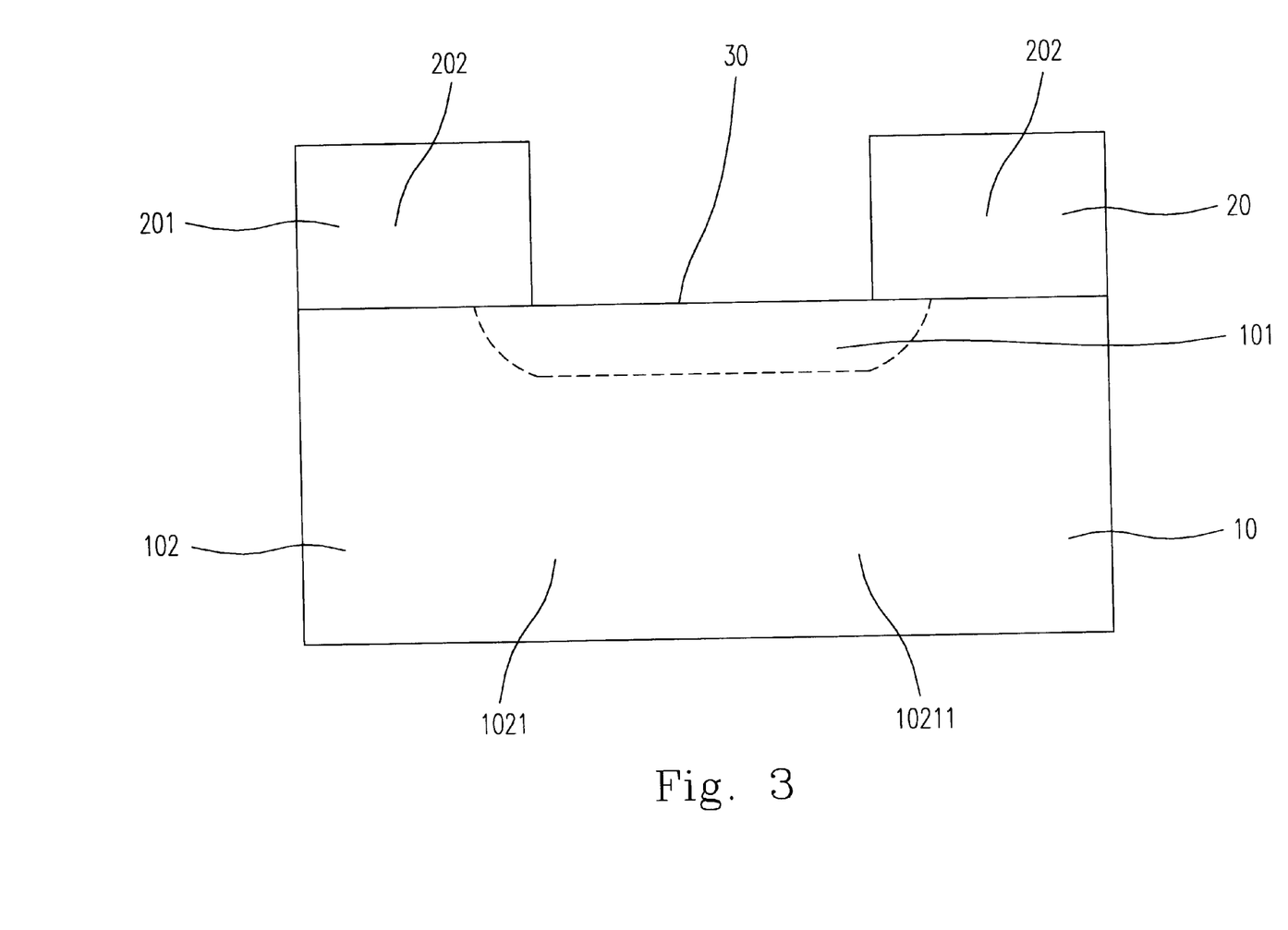
FIG. 3 shows the etching condition of the GaAs masking layer according to the present invention.

Referring now to FIG. 3, there is shown the etching condition of the GaAs masking layer according to the present invention. It illustrates a method to form the patterned porous silicon in FIG. 1(e), which includes steps of:
a) providing a silicon substrate 10; b) growing a GaAs layer 20 on the silicon substrate 10; c) defining a pattern for the GaAs layer 20 by a photolithography process and etching the patterned GaAs layer 20 to obtain a GaAs mask 201; and d) forming a porous silicon layer 101 by anodic-oxidation-etching the silicon substrate 10 uncovered by the GaAs mask 201. By this method, the etching under the GaAs masking layer 20 on the silicon substrate 10 can be executed very well to form the porous silicon layer 101.

In step c), the patterned GaAs layer 20 is etched by a wet etching or a dry etching processes with a photoresist as a mask. And the wet etching process or the dry etching process for the pattern transfer is executed by the photoresist. However, the anodic-oxidation-etching process in step d) is an electrolytic process executed in an HF acidic solution. The HF acidic solution can be a mixture of 30 vol. % HF and 70 vol. % H$_2$O. The normally available concentrated acid is 49 wt. % HF. The electrolytic process can be executed for five minutes in a current density of 3.5 mA/cm$^2$.

Of course, the silicon substrate 10 can be a wafer 102 composed of crystalline silicon 1021 which is of p type. The present silicon substrate 10211 is a boron-doped substrate having a resistivity of 20–30 Ω-cm, a (100) off 4° toward (001). In addition, the silicon wafer 102 could alternatively be an n-type doped crystalline silicon. By the way, in step b), the GaAs layer 20 is deposited on the silicon substrate 10 as an epilayer by vapor phase epitaxy (VPE) which is a process of chemical vapor deposition (CVD) that can be executed by two-stage organometallic chemical vapor deposition (MOCVD). After the GaAs is formed and becomes a masking layer, we should anisotropically etch the silicon substrate 10 to form the porous silicon 101 by an electrolytic process executed in an HF acidic solution.

At this time, the present invention processes the slice with wet etching which is an anodic oxidation etching and uses the GaAs masking layer 202 as a GaAs Mask 201. The other possible method to deposit the GaAs layer 20 in step b) is to grow it on the silicon substrate 10 by molecular beam epitaxy (MBE). And another possible method to deposit the GaAs layer 20 in step b) is to form it on the silicon substrate 10 by liquid phase epitaxy (LPE). On the other hand, the GaAs layer 20 is a single-crystal film of groups IIIA–VA.

Figure 4A:
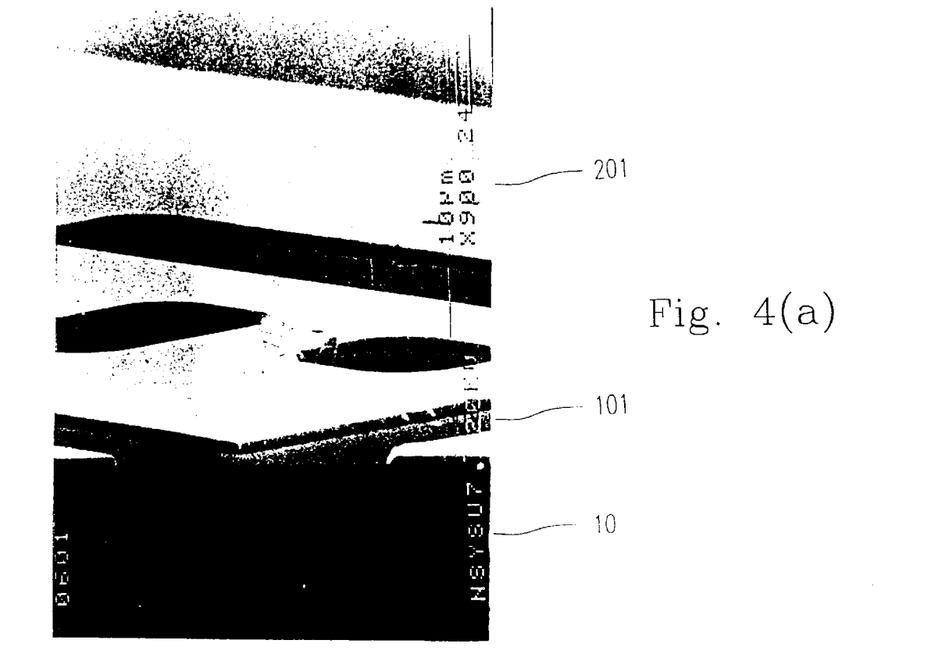
FIG. 4(a) is a scanning electron microscope photograph of a cross-section of patterned porous silicon formed by the present GaAs masking layer in FIG. 1(e)
Figure 4B:
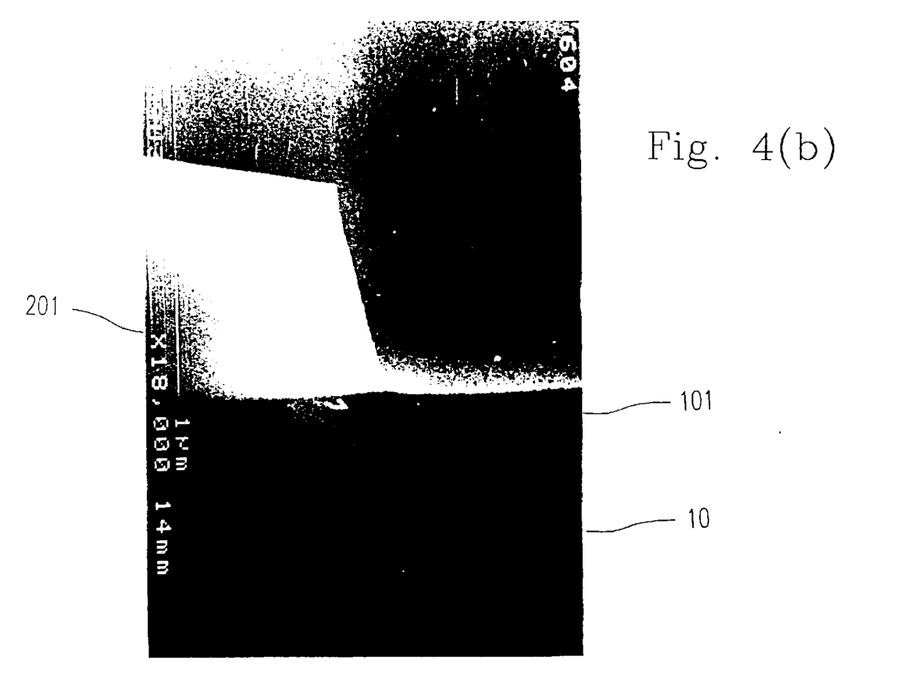
FIG. 4(b) is a locally amplified photogragh of the present GaAs masking layer in FIG. 4(a)

Refer to FIGS. 4(a) & 4(b), in which the former is a scanning electron microscope photograph of a cross-section of patterned porous silicon formed by the present GaAs masking layer in FIG. 1(e) and the latter is a locally amplified photogragh of the former. FIG. 4(a) is magnified by 900 times, in which the bar scale is 10 μm and 0.9 mm is represented by 1 μm. FIG. 4(b) is an amplified photograph of FIG. 4(a) and is magnified by 18,000 times, in which the bar scale is 1 μm and 1.8 cm is represented by 1 μm. We should note that FIG. 4(a) is the cross-sectional scanning electron microscope photograph of FIG. 1(e), and shows the patterned porous silicon 101 on the silicon substrate 10 defined by utilizing the GaAs mask 201. In FIG. 4(a), the electrolytic conditions are the same as those in FIG. 1(e). And FIG. 4(b) is the amplified photograph of the masking layer in FIG. 4(a).

Now by comparing the FIG. 4(b) with the FIG. 2(b), we can find that the GaAs mask 201 is better than the silicon nitride mask, because the transverse growth size and the vertical growth size of the porous silicon under the present GaAs mask 201 are almost in the ratio of 0.7:1 after the electrolytic process in FIG. 4(a) where the growth condition of the porous silicon is transversely compressed. As shown, the adherence between the GaAs film (i.e. the GaAs mask 201) and the transverse growth portion of the porous silicon keeps very well, so the GaAs film 201 would not be stripped off during the electrolytic process. It is thus proved that the porous silicon according to the present invention is obtained by an anisotropic growth. As a result, the growth of the porous silicon under the GaAs masking layer 202 is transversely compressed, but the growth under the silicon nitride mask 204 is transversely expanded. By comparing the two masking layers 202, 204, we can know that the GaAs masking layer 202 is more suitable to define the patterned porous silicon. And it is apparent that the lifetime of the GaAs masking layer 202 is even longer than that of the silicon nitride masking layer 204.

Figure 5:
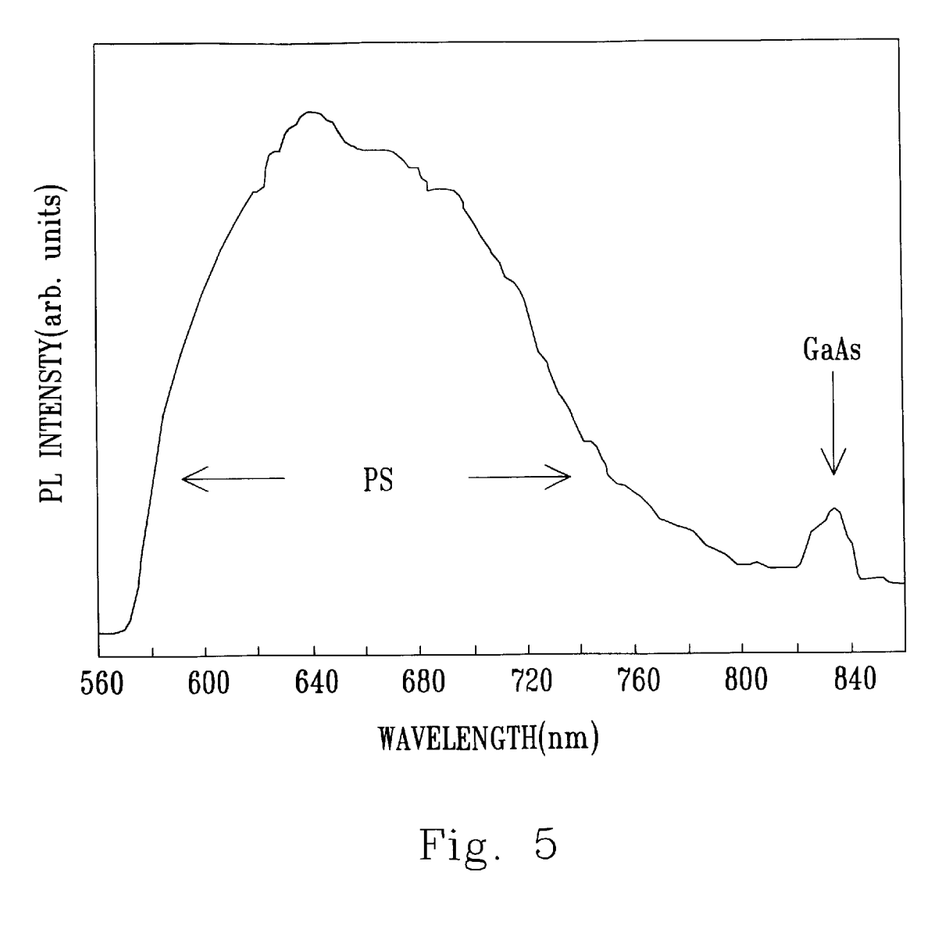
FIG. 5 shows a photoluminescence of the patterned porous silicon formed by utilizing the GaAs masking layer in FIG. 4(a) according to the present invention.

FIG. 5 shows a photoluminescence of the patterned porous silicon formed by utilizing the GaAs masking layer in FIG. 4(a) according to the present invention. It displays the PL intensity (arb. units) for porous silicon and GaAs as a function of wavelength (nm). We can see the high intensity peak formed by the porous silicon is at around 640 nm. On the other hand, the weak intensity peak, which is formed by the present GaAs, is at around 830 nm. From this we know that the crystalline property of the GaAs mask still keeps the same as its primary one before the electrolytic process for forming the porous silicon. It can be known that the GaAs masking layer can be repeatedly used.

The following reasons a) & b) account for the phenomenon which contributes to the difference of the ratios of transverse and vertical growth sizes of the porous silicon under silicon nitride and GaAs masking layers.

a) The holes stack on the silicon substrate close to the junction of the silicon substrate and the silicon nitride, this being due to the fact that the silicon substrate is forward biased. Therefore, holes will reinforce the transverse growth of the porous silicon under the silicon nitride masking layer. On the contrary, the depletion caused by the heterogeneous junction of the GaAs and the silicon will weaken the transverse growth of the porous silicon under the GaAs masking layer.

b) The gradual diminution of the contact area of the silicon substrate and the silicon nitride or the weakening bonding force is due to the fact that the stress, being about $1.2 \times 10^{10}$ dyne/cm$^2$, of the silicon nitride formed on the silicon substrate is larger than the stress, being about $1.8 \times 10^9$ dyne/cm$^2$, of the GaAs formed on the silicon substrate. Therefore, it leads to the strip off of the silicon nitride film from the porous silicon that speeds up the transverse growth to cause a serious distortion of the grown porous silicon.

While the invention has been described in terms of what are considered to be the most practical and preferred embodiment, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and equivalent structures.

What I claim is:

1. A method for forming porous silicon, comprising steps of:
    a) providing a silicon substrate;
    b) growing a GaAs layer on said silicon substrate;
    c) forming a GaAs mask by partially removing said GaAs layer; and
    d) forming a porous silicon layer in said silicon substrate uncovered by said GaAs mask by anodic-oxidation-etching.

2. A method according to claim 1 wherein said step (c) is executed by a process selected from a wet etching and a dry etching process with a photoresist as a mask.

3. A method according to claim 1 wherein said anodic-oxidation-etching process in said step d) is an electrolytic process executed in an HF acidic solution.

4. A method according to claim 3 wherein said HF acidic solution is a mixture of 30 vol. % HF and 70 vol. % H$_2$O.

5. A method according to claim 3 wherein said electrolytic process is executed for five minutes in a current density of 3.5 mA/cm$^2$.

6. A method according to claim 1 wherein said silicon substrate is composed of crystalline silicon.

7. A method according to claim 6 wherein said silicon substrate is of p-type.

8. A method according to claim 1 wherein said silicon substrate is a boron-doped substrate having a resistivity of 20–30 Ω-cm, a (100) off 4° toward (001).

9. A method according to claim 1 wherein said silicon substrate is composed of n-type crystalline silicon.

10. A method according to claim 1 wherein in said step b), said GaAs layer is deposited on said silicon substrate as an epilayer by vapor phase epitaxy.

11. A method according to claim 10 wherein said vapor phase epitaxy is a process of chemical vapor deposition.

12. A method according to claim 11 wherein said chemical vapor deposition is executed by two-step organometallic chemical vapor deposition.

13. A method according to claim 1 wherein in said step b), said GaAs layer is grown on said silicon substrate by molecular beam epitaxy.

14. A method according to claim 13 wherein said GaAs layer is a single-crystal film.

15. A method according to claim 1 wherein in said step b), said GaAs layer is formed on said silicon substrate by liquid phase epitaxy.

16. A method according to claim 15 wherein said GaAs layer is a single-crystal film.

* * * * *